(12) United States Patent
Matsuhashi et al.

(10) Patent No.: US 11,971,653 B2
(45) Date of Patent: Apr. 30, 2024

(54) PHOTOMASK BLANK, METHOD FOR PRODUCING PHOTOMASK, AND PHOTOMASK

(71) Applicant: SHIN-ETSU CHEMICAL CO., LTD., Tokyo (JP)

(72) Inventors: Naoki Matsuhashi, Joetsu (JP); Kouhei Sasamoto, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 403 days.

(21) Appl. No.: 17/614,808

(22) PCT Filed: Apr. 20, 2020

(86) PCT No.: PCT/JP2020/017009
§ 371 (c)(1),
(2) Date: Nov. 29, 2021

(87) PCT Pub. No.: WO2020/241116
PCT Pub. Date: Dec. 3, 2020

(65) Prior Publication Data
US 2022/0229358 A1    Jul. 21, 2022

(30) Foreign Application Priority Data
May 31, 2019    (JP) ................................. 2019-102162

(51) Int. Cl.
G03F 1/32    (2012.01)
G03F 1/24    (2012.01)
G03F 1/26    (2012.01)
G03F 1/58    (2012.01)
G03F 1/80    (2012.01)

(52) U.S. Cl.
CPC .................. *G03F 1/24* (2013.01); *G03F 1/26* (2013.01); *G03F 1/32* (2013.01); *G03F 1/58* (2013.01); *G03F 1/80* (2013.01)

(58) Field of Classification Search
CPC ..... G03F 1/24; G03F 1/26; G03F 1/32; G03F 1/58
USPC ........................................................... 430/5
See application file for complete search history.

(56) References Cited

U.S. PATENT DOCUMENTS

| 2011/0229807 A1 | 9/2011 | Hashimoto et al. |
| 2017/0139316 A1 | 5/2017 | Shishido et al. |

FOREIGN PATENT DOCUMENTS

| JP | 60-182439 A | 9/1985 |
| JP | 2983020 B1 | 11/1999 |
| JP | 2002-287330 A | 10/2002 |
| JP | 2003-248298 A | 9/2003 |
| JP | 2004-53663 A | 2/2004 |
| JP | 2014-197215 A | 10/2014 |
| JP | 2018-49111 A | 3/2018 |
| JP | 2018-87998 A | 6/2018 |
| JP | 2018-106023 A | 7/2018 |

OTHER PUBLICATIONS

International Search Report (PCT/ISA/210) issued in PCT/JP2020/017009, dated Jul. 14, 2020.

*Primary Examiner* — Christopher G Young
(74) *Attorney, Agent, or Firm* — Birch, Stewart, Kolasch & Birch, LLP

(57) ABSTRACT

The present invention provides a photomask blank which exhibits high adhesion of a resist film to a film containing chromium, and which is capable of achieving good resolution limit and good CD linearity during the formation of an assist pattern of a line pattern, said assist pattern supplementing the resolution of the main pattern of a photomask. A photomask blank (511) according to the present invention is provided, on a substrate, with: a film (21) to be processed; and, sequentially from the far side from the substrate, a first layer (311) which contains oxygen and nitrogen, while having a chromium content of 40% by atom or less, an oxygen content of 50% by atom or more, a nitrogen content of 10% by atom or less and a thickness of 6 nm or less, a second layer (312) which contains oxygen, nitrogen and carbon, while having a chromium content of 40% by atom or less, an oxygen content of 30% by atom or more, a nitrogen content of 17% by atom or more, a carbon content of 13% by atom or less and a thickness of 46 nm or more, and a third layer (313) which contains oxygen and nitrogen, while having a chromium content of 50% by atom or more, an oxygen content of 20% by atom or less and a nitrogen content of 30% by atom or more.

16 Claims, 5 Drawing Sheets

PHOTOMASK BLANK, METHOD FOR PRODUCING PHOTOMASK, AND PHOTOMASK

TECHNICAL FIELD

The present invention relates to a photomask blank used in the fabrication of semiconductor devices, a method for manufacturing a photomask using the same, and a photomask.

BACKGROUND ART

In recent years, with the scaling of semiconductor devices, and particularly on account of the increasing level of integration in large-scale integrated circuits, a high pattern resolution is desired in projection exposure. Thus, the phase shift mask has been developed as a way to improve the resolution of the transferred pattern in a photomask. The principle behind phase shifting is as follows: by adjusting the phase of transmitted light which has passed through an opening in a photomask so that it is inverted about 180 degrees relative to the phase of transmitted light which has passed through a region adjoining the opening, mutual interference of the transmitted light weakens the light intensity at the boundary, as a result of which the resolution and depth of focus of the transferred pattern are improved. Photomasks which use this principle are generally called phase shift masks.

The phase shift mask blanks used in phase shift masks most commonly have a structure in which a phase shift film has been deposited on a transparent substrate such as a glass substrate, and a chromium (Cr)-containing film has been deposited on the phase shift film. The phase shift film typically has a phase difference of between 175 and 185 degrees and a transmittance of about 6 to 30% to the exposure light, and is predominantly formed of a film containing molybdenum (Mo) and silicon (Si). The chromium-containing film is adjusted to a thickness which, in combination with the phase shift film, results in the desired optical density. The chromium-containing film generally serves as a light-shielding film and also serves as a hardmask film for etching the phase shift film.

The method of forming a phase shift mask pattern from this phase shift mask blank involves, more specifically, forming a resist film on the chromium-containing film of the phase shift mask blank, writing a pattern with light or an electron beam on the resist film, developing the resist film to form a resist pattern, and etching the chromium-containing film using this resist pattern as an etching mask to form a pattern. Additionally, the phase shift film is etched using this chromium-containing film pattern as the etching mask to form a phase shift film pattern, following which the resist pattern and the chromium-containing film pattern are removed.

Here, outside that portion of the phase shift film pattern where a circuit pattern has been formed, the light-shielding film is left behind and is rendered into a light-shielding area (light-shielding film pattern) at the outer peripheral edge of the phase shift mask such that the combined optical density of the phase shift film and the light-shielding film becomes 3 or more. This is to prevent unwanted exposure light from leaking and irradiating the resist film on adjacent chips located outside the circuit pattern when the circuit pattern is transferred to a wafer using a wafer exposure system. The method of forming such a light-shielding film pattern generally involves forming a phase shift film pattern, removing the resist pattern, and subsequently etching the chromium-containing film using as the etching mask a resist pattern formed by newly forming a resist layer, pattern writing and development, so as to create a light-shielding film pattern on the outer peripheral edge.

In a phase shift mask where high-precision pattern formation is needed, etching is carried out predominantly by dry etching using a gas plasma. Dry etching using an oxygen-containing chlorine-based gas (chlorine-based dry etching) is utilized for dry etching films containing chromium, and dry etching using a fluorine-based gas (fluorine-based dry etching) is utilized for dry etching films containing molybdenum and silicon. In particular, it is known that, when dry etching a chromium-containing film, using an etching gas obtained by mixing from 10 to 25 vol % of oxygen gas into a chlorine-based gas increases the chemical reactivity and elevates the etch rate.

As circuit patterns become finer, techniques for creating small features are desired in phase shift mask patterns as well. In particular, a line pattern assist pattern, which assists the resolution of the main pattern on a phase shift mask, must be formed smaller than the main pattern so as not to be transferred to the wafer when transferring a circuit pattern to a wafer using a wafer exposure system. In phase shift masks of the generation where the line-and-space pattern of a circuit on a wafer has a pitch of 10 nm, it is desired that the linewidth of the line pattern assist pattern on the phase shift mask be about 40 nm.

Chemically amplified resists for fine pattern formation are composed of, for example, a base resin, an acid generator and a surfactant. Because many reactions in which an acid generated by exposure acts as a catalyst can be employed, higher sensitivity is possible, enabling the formation of mask patterns, such as fine phase shift mask patterns having a linewidth of 0.2 µm or less, using chemically amplified resists. However, as the pattern linewidth becomes smaller, collapse of the fine pattern due to developer impingement in the development process occurs and a resolution limit is reached.

For example, in the method described in JP-A 2014-197215 (Patent Document 1), in order to form a fine assist pattern, collapse of the fine pattern in the development step is reduced by making the resist film thinner. In this method, carbon is added to the chromium-containing film serving as the etching mask film, making it a film having a rapid etch rate. In cases where, during the etching of a chromium-containing film using a resist film, the resist film too is etched at the same time as the chromium-containing film and the resist film disappears during etching of the chromium-containing film, pinholes form in the surface layer of the chromium-containing film. Hence, it is necessary for sufficient resist film to remain following etching of the chromium-containing film. However, the method of JP-A 2014-197215 has a rapid etch rate for chromium-containing films and so, because etching of the chromium-containing film reaches completion relatively quickly, the resist film can be made thin.

As the transfer pattern becomes finer, small defects on a photomask such as a phase shift mask adversely affect transfer of the circuit pattern to a wafer during exposure. Small defects include protruding defects adjacent to the photomask pattern such as a phase shift film pattern and dot defects that arise individually on the transparent substrate. When an area differing from the desired pattern is present in even one place on the circuit pattern in a photomask, this may become a critical defect. A properly functioning electronic device cannot be fabricated from such a photomask.

Hence, following the production of a photomask such as a phase shift mask by forming a photomask pattern such as a phase shift film pattern, the photomask is inspected for defects with a visual inspection system and any detected defects are removed with a pattern defect repair system. Defect repair techniques that exist include mechanical methods, laser methods, ion beam methods and electron beam methods. For defects 100 nm or smaller in size, an electron beam method having a high repair accuracy is generally used. Repair by an electron beam method, in the case of pattern defects in a phase shift film, takes about 10 to 20 minutes per defect. In addition, wafer transfer simulation to confirm that a repair site will not adversely affect wafer transfer takes about 20 to 50 minutes per repair site. Therefore, to reduce the time required for the production of a photomask such as a phase shift mask, it is advantageous for the total number of defects on the photomask to be as low as possible.

Most of the defects that arise in a photomask pattern such as a phase shift film pattern occur during a photomask production process such as development, dry etching or cleaning, although defects arise even in production of the photomask blank such as a phase shift mask blank. Because a photomask blank defect also becomes a defect in the photomask such as a phase shift mask, defect inspection with a laser inspection system is typically carried out even on photomask blanks. Using a photomask blank having a small number of defects reduces the total number of defects on the photomask, reducing the time taken for photomask defect repair and wafer transfer simulation and thereby shortening the time required for the production of a photomask such as a phase shift mask.

In addition, the CD linearity, which indicates whether the critical dimension (CD) of a photomask agrees with the design value, is important because it represents the critical dimension accuracy. A poor CD linearity means that the desired pattern cannot be produced; in state-of-the-art photomasks, a CD linearity in the range of 10 nm or less is desired at design values of from 800 nm to 50 nm. However, in cases where a chromium-containing film is chlorine-based dry etched using a photoresist pattern to form a chromium-containing film pattern, even if the CD linearity of the resist pattern agrees with the design value, when a small space pattern is formed in the chromium-containing film, etching is inadequate because the probability of plasma entering the surface layer of the chromium-containing film is lower than for a large space pattern. As a result, in a small space pattern, the spaces end up being formed to a smaller size than the desired size for those spaces. This is known as microloading.

PRIOR ART DOCUMENTS

Patent Documents

Patent Document 1: JP-A 2014-197215
Patent Document 2: Japanese Patent No. 2983020

SUMMARY OF INVENTION

Technical Problem

In addition to the above-described photomask defects, defects caused by the resist film are also a problem. In a photomask blank having a silicon-containing film and a chromium-containing film formed in this order on a substrate such as a transparent substrate, when particles arise at the surface or interior of the resist film formed by coating a resist onto the chromium-containing film, this leads to a rise in photomask defects. For this reason, it is common to carry out the process of first removing the formed resist film by stripping and cleaning, and then again applying the resist to form a resist film.

A mixture of sulfuric acid and hydrogen peroxide (sulfuric-peroxide mixture, SPM) is commonly used for stripping and cleaning the resist film. In this case, after the resist film has been stripped using a mixture of sulfuric acid and hydrogen peroxide, the surface of the chromium-containing film is acidic and, for the sake of neutralization, is rinsed using an ammoniated solution (ammonia-hydrogen peroxide mixture, APM), which is alkaline. However, sulfuric acid generally cannot be completely removed from the surface of the chromium-containing film, and so sulfate ions remain on the chromium-containing film surface. When sulfate ions remain on the surface of the chromium-containing film, this worsens adhesion with the resist film that is subsequently formed, facilitating collapse of the line pattern due to developer impingement during development and impingement by the rinse solution in the rinsing step, as a result of which worsening of the line pattern resolution is a concern. It is thus desired that the chromium-containing film have a good adhesion with the resist film and that, even when stripping of the resist film is carried out using the above-mentioned mixture of sulfuric acid and hydrogen peroxide, the adhesion does not worsen.

For example, in the method described in JP-A 2014-197215, the chromium-containing film can be formed to a thickness of 20 nm or less, thus enabling the resist film to be made thinner. However, it was found in this case that, because the chromium-containing film in this case is thin and, in particular, the oxygen in the surface layer portion of the chromium-containing film is inadequate, the oxygen in the chromium-containing film that confers adhesion with the resist film when a resist is coated onto the chromium-containing film is not adequately supplied to the interface between the chromium-containing film and the resist film, and so a sufficient assist pattern resolution cannot be obtained. It was also found that, because the chromium-containing film contains carbon, when stripping of the resist film has been carried out using the above mixture of sulfuric acid and hydrogen peroxide, the carbon-containing film chemically reacts more readily than a carbon-free film and sulfate ions tend to remain on the surface of the chromium and carbon-containing film, as a result of which, when the chromium-containing film is again coated with resist to form a resist film, adhesion of the resist film to the chromium-containing film worsens and a sufficient assist pattern resolution cannot be obtained.

The method described in Japanese Patent No. 2983020 (Patent Document 2) provides, as a metal film deposited on a phase shift film, a film made of a chromium-containing material and varies the constituents thereof in the thickness direction toward the transparent substrate, giving the film a structure such that the etch rate rises in a stepwise or continuous manner from the metal film surface side toward the transparent substrate side, making it possible to prevent metal from the metal film from remaining on the phase shift film. It is possible in this case to give the metal film a multilayer structure, and is also possible to give the metal film a structure having a rapid etch rate layer below a thin surfacemost layer on the side in contact with the resist film. In this case, the resist film can be made a thin layer. In this method, nitrogen contained in the metal film is an ingredient that speeds up the etch rate, and so nitrogen is included in the metal film to speed up the etch rate. However, in such a metal film, the oxygen in the chromium-containing film that imparts adhesion with the resist film when resist is coated onto the chromium-containing film is not sufficiently supplied to the interface between the chromium-containing film and the resist film, and so a satisfactory assist pattern resolution is not obtained.

In state-of-the-art photomasks, the CD accuracy is important. As mentioned above, a CD linearity in the range of 10 nm or less is desired at design values of from 800 nm to 50 nm. Additionally, in order to set the initial resist film thickness to 150 nm or less, it is desired that the chromium-containing film be a film having a rapid etch rate to chlorine-based dry etching. In the above-described method of Japanese Patent No. 2983020, nitrogen is included in the metal film. However, in this case, the metal film does not include the etch rate-enhancing constituent oxygen; because there is no supply of oxygen from the film during chlorine-based dry etching, plasma does not fully act within the small space pattern, as a result of which it was found that a sufficient space pattern CD linearity cannot be obtained.

The present invention was conceived in order to resolve the above problems, one object of the invention being to provide a photomask blank wherein a resist film has a high adhesion to a chromium-containing film, wherein even when the resist film formed on the chromium-containing film is stripped using a mixture of sulfuric acid and hydrogen peroxide and a resist film is again formed, adhesion by the resist film to the chromium-containing film does not worsen, wherein, in the formation of a line pattern assist pattern that assists the resolution of the main pattern on a photomask such as a phase shift mask, a good resolution limit can be achieved, and wherein a good space pattern CD linearity can be achieved in a small space pattern. Further objects of the invention are to provide a method for manufacturing a photomask using such a photomask blank, and to provide a photomask.

Solution to Problem

In order to achieve these objects, the inventors have conducted intensive investigations on photomask blanks which have a substrate such as a transparent substrate, a film made of a chromium-containing material, and a film to be processed that is formed on a substrate side of the film made of a chromium-containing material and is processed using a pattern on the film made of the chromium-containing material as an etching mask. As a result, the inventors have learned that resist film adhesion to the chromium-containing film is good in an oxygen and nitrogen-containing film which contains much oxygen, that sulfate ions do not readily remain behind on the surface of such an oxygen and nitrogen-containing film containing much oxygen when stripping of the resist film is carried out using a mixture of sulfuric acid and hydrogen peroxide, and that, in the dry etching of a small space pattern on a film made of the chromium-containing material, etching is promoted when a greater amount of oxygen is included; and have discovered that it is effective for the film made of a chromium-containing material to be a layered film having a three-layer structure consisting of, in order from a side away from the substrate, a first layer, a second layer and a third layer in which the first layer contains oxygen and nitrogen and has a chromium content of 40 atom % or less, an oxygen content of 50 atom % or more and a nitrogen content of 10 atom % or less, the second layer contains oxygen, nitrogen and carbon and has a chromium content of 40 atom % or less, an oxygen content of 30 atom % or more, a nitrogen content of 17 atom % or more and a carbon content of 13 atom % or less, the third layer contains oxygen and nitrogen and has a chromium content of 50 atom % or more, an oxygen content of 20 atom % or less and a nitrogen content of 30 atom % or more, and the first layer has a thickness of 6 nm or less and the second layer has a thickness of 46 nm or more.

Moreover, the inventors have found that in such a photomask blank, examples of which include a phase shift mask blank in which a phase shift film that is a film made of a silicon-containing material has been formed as the film to be processed and a reflective mask blank in which an absorption film that is a film made of a tantalum-containing material has been formed as the film to be processed, resist film adhesion to the chromium-containing film is high and, even when the resist film formed on the chromium-containing film is stripped using a mixture of sulfuric acid and hydrogen peroxide and a resist film is again formed, adhesion of the resist film to the chromium-containing film does not worsen. Hence, they have discovered that, even in cases where a photomask is manufactured by an ordinary method for manufacturing photomasks, a good resolution limit can be achieved in formation of a line pattern assist pattern for assisting the resolution of the main pattern on the photomask, and that a good space pattern CD linearity can be achieved in a small space pattern.

Accordingly, the present invention provides the following photomask blank, the following method for manufacturing a photomask, and the following photomask.

1. A photomask blank having a substrate, a film made of a chromium-containing material, and a film to be processed which is formed on a substrate side of the film made of a chromium-containing material and is processed using a pattern of the film made of a chromium-containing material as an etching mask, wherein the film made of a chromium-containing material is a layered film having a three-layer structure consisting of, in order from a side away from the substrate, a first layer, a second layer and a third layer, the first layer containing oxygen and nitrogen, and having a chromium content of 40 atom % or less, an oxygen content of 50 atom % or more, a nitrogen content of 10 atom % or less and a thickness of 6 nm or less;

the second layer containing oxygen, nitrogen and carbon, and having a chromium content of 40 atom % or less, an oxygen content of 30 atom % or more, a nitrogen content of 17 atom % or more, a carbon content of 13 atom % or less and a thickness of 46 nm or more; and the third layer containing oxygen and nitrogen, and having a chromium content of 50 atom % or more, an oxygen content of 20 atom % or less and a nitrogen content of 30 atom % or more.

2. The above photomask blank, wherein the third layer has a thickness of 4 nm or less.

3. The above photomask blank, wherein the film to be processed is a film made of a silicon-containing material.

4. The above photomask blank which is a phase shift mask blank wherein the film made of a chromium-containing material is a light-shielding film, the film made of a silicon-containing material is a phase shift film, and the light-shielding film and the phase shift film have a combined optical density to exposure light of 3 or more.

5. The above photomask blank, wherein the film made of a chromium-containing material has a thickness of at least 48 nm and not more than 85 nm.

6. The above photomask blank, wherein the phase shift film has a phase difference with respect to exposure light of at least 175 degrees and not more than 185 degrees, a transmittance of at least 6% and not more than 30%, and a thickness of at least 60 nm and not more than 85 nm.

7. The above photomask blank, wherein the film to be processed is a film made of a tantalum-containing material.

8. The above photomask blank which is a reflective mask blank wherein the film made of a tantalum-containing material is a film for absorbing extreme ultraviolet light (absorption film), the reflective mask blank further having a film for reflecting extreme ultraviolet light (reflection film) that is formed on the substrate side of the absorption film.

9. The above photomask blank, further having, on a side of the film made of a chromium-containing material which is away from the substrate, a resist film having a thickness at least 50 nm and up to 200 nm.

10. A method of manufacturing, from the above photomask blank, a photomask having a circuit pattern in a film made of a silicon-containing material, which method includes the steps of:

(A) forming a resist film on the side of the film made of a chromium-containing material that is away from the substrate;

(C) patterning the resist film to form a resist pattern;

(D) patterning the film made of a chromium-containing material by dry etching the film with an oxygen-containing chlorine-based gas using the resist pattern as an etching mask so as to form a pattern in the film made of a chromium-containing material;

(E) patterning the film made of a silicon-containing material by dry etching the film with a fluorine-based gas using the pattern in the film made of a chromium-containing material as an etching mask so as to form a pattern in the film made of a silicon-containing material; and (F) following step (E), leaving a portion of the film made of a chromium-containing material located at an outer peripheral edge of the substrate that is a region where a circuit pattern is not formed in the film made of a silicon-containing material and removing the pattern in the film made of a chromium-containing material in areas other than at the outer peripheral edge of the substrate by dry etching with an oxygen-containing chlorine-based gas.

11. The above manufacturing method, further including, between steps (A) and (C), the step of:

(B) stripping the resist film using a mixture of sulfuric acid and hydrogen peroxide and then newly forming a resist film on the side of the film made of a chromium-containing material that is away from the substrate.

12. A photomask having a substrate and, on the substrate, a circuit pattern in a film made of a silicon-containing material, wherein a film made of a chromium-containing material is formed, in contact with the film made of the silicon-containing material, in a region located at an outer peripheral edge of the substrate where the circuit pattern in the film made of a silicon-containing material is not formed, the film made of the chromium-containing material is a layered film having a three-layer structure consisting of, in order from a side away from the substrate, a first layer, a second layer and a third layer, the first layer containing oxygen and nitrogen, and having a chromium content of 40 atom % or less, an oxygen content of 50 atom % or more, a nitrogen content of 10 atom % or less and a thickness of 6 nm or less;

the second layer containing oxygen, nitrogen and carbon, and having a chromium content of 40 atom % or less, an oxygen content of 30 atom % or more, a nitrogen content of 17 atom % or more, a carbon content of 13 atom % or less and a thickness of 46 nm or more; and the third layer containing oxygen and nitrogen, and having a chromium content of 50 atom % or more, an oxygen content of 20 atom % or less and a nitrogen content of 30 atom % or more.

13. The above photomask, wherein the third layer has a thickness of 4 nm or less.

14. The above photomask, wherein the film made of a chromium-containing material is a light-shielding film, the film made of a silicon-containing material is a phase shift film, and the light-shielding film and the phase shift film have a combined optical density to exposure light of 3 or more.

15. The above photomask, wherein the film made of the chromium-containing material has a thickness of at least 48 nm and not more than 85 nm.

16. The above photomask, wherein the phase shift film has a phase difference with respect to exposure light of at least 175 degrees and not more than 185 degrees, a transmittance of at least 6% and not more than 30%, and a thickness of at least 60 nm and not more than 85 nm.

Advantageous Effects of Invention

The photomask blank of the invention has a high resist film adhesion to the chromium-containing film and, even when a special development process or special dry etching process is not used and the photomask is manufactured by a conventional photomask manufacturing method, collapse of the fine line pattern due to developer impingement in the development process is prevented, making it possible, in the formation of a line pattern assist pattern that assists the resolution of the main pattern on the photomask, to achieve a good resolution limit and a good CD linearity. In addition, even when a resist film formed on a chromium-containing film is stripped using a mixture of sulfuric acid and hydrogen peroxide and a new resist film is formed, adhesion of the resist film to the chromium-containing film does not worsen. Therefore, even when re-formation of the resist film by the re-coating of resist is carried out in order to avoid photomask defects due to incidental particles in the resist when a resist layer was formed by resist coating, a good resolution limit can be similarly achieved.

DESCRIPTION OF EMBODIMENTS

Figure 1:
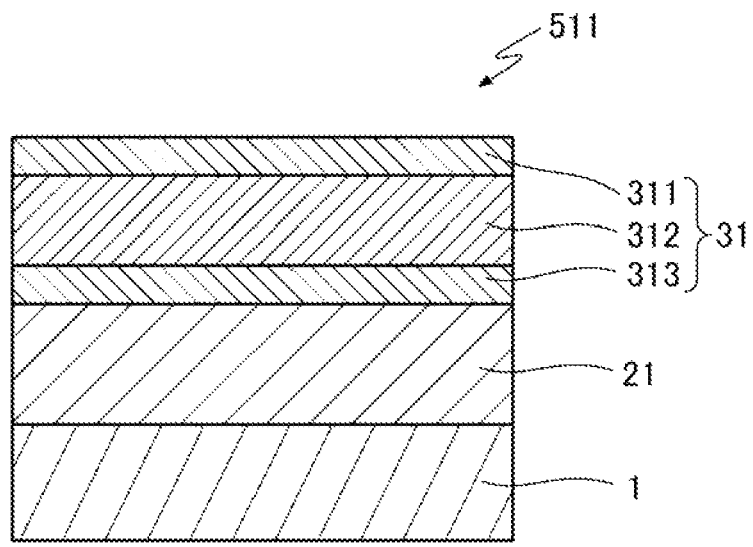
FIG. 1 is a cross-sectional view showing an example of a first embodiment (phase shift mask blank) of the photomask blank of the invention.

The invention is described more fully below.

The photomask blank of the invention has a substrate, a film made of a chromium-containing material, and a film to be processed which is formed on a substrate side of the film made of a chromium-containing material and is processed using a pattern of the film made of a chromium-containing material as an etching mask. That is, the photomask blank of the invention has, on a substrate and in order from the substrate side: a film to be processed and a film made of a chromium-containing material. The film made of a chromium-containing material is formed in contact with the film to be processed. In this invention, the film made of a chromium-containing material is a layered film having a three-layer structure consisting of, in order from the side away from the substrate: a first layer, a second layer and a third layer.

A photomask having, on a substrate, a circuit pattern in a processed film such as a film made of a silicon-containing material or a film made of a tantalum-containing material can be manufactured from the photomask blank of the invention. In particular, a photomask in which a film made of a chromium-containing material is formed, in contact with a film made of a silicon-containing material, on a portion of the film made of a silicon-containing material on the photomask which is located at an outer peripheral edge of the substrate that is a region where a circuit pattern is not formed (i.e., a region other than the region where the circuit pattern is formed (effective region)) can be manufactured from this photomask blank.

The substrate is not particularly limited as to the type of substrate and the substrate size. In a reflective photomask blank and photomask, it is not always necessary for the substrate to be transparent at the wavelength used as the exposure wavelength. However, particularly in transmissive photomask blanks and photomasks, a transparent substrate such as a quartz substrate, which is transparent to the wavelength used as the exposure wavelength, is employed. For example, a substrate referred to as a 6025 substrate, which is 6 inches square and 0.25 inch thick, as specified in the SEMI Standards, is suitable. When the SI unit system is used, a 6025 substrate is generally denoted as a 152 nm square substrate having a thickness of 6.35 mm.

When the film to be processed is a film made of a silicon-containing material, an optical film such as a light-shielding film, anti-reflective film or halftone phase shift film that can be used in a transmissive photomask is suitable as the film made of a silicon-containing material.

When the film made of a silicon-containing material is a phase shift film (e.g., a halftone phase shift film), the photomask blank is a phase shift mask blank (halftone phase shift mask blank), and a phase shift mask (e.g., a halftone phase shift mask) is manufactured from the phase shift mask blank.

A phase shift mask having, on a transparent substrate, a phase shift film pattern that includes a circuit pattern (photomask pattern) can be manufactured from this phase shift mask blank. A phase shift mask in which a film made of a chromium-containing material is formed in contact with, of the phase shift film on the phase shift mask, the phase shift film in an area located at an outer peripheral edge of the transparent substrate that is a region where a circuit pattern is not formed can be manufactured from this phase shift mask blank. This film made of a chromium-containing material is preferably a light-shielding film. When a phase shift mask is manufactured from a phase shift mask blank, part of the hardmask film used as the etching mask in etching of the phase shift film can be left behind to serve as a light-shielding film.

The phase shift film has a phase difference with respect to exposure light that is preferably at least 175 degrees and not more than 185 degrees. Also, the phase shift film has a transmittance with respect to exposure light which is preferably at least 6% and not more than 30%, within which range the transfer pattern resolution and depth of focus effects due to the phase shift effect under the exposure conditions are high. The phase shift film has a thickness which, from the standpoint of setting the phase difference and the transmittance within the indicated ranges, is preferably at least 60 nm and not more than 85 nm.

The structure of the photomask blank and the photomask, and the method of manufacturing a photomask from a photomask blank, according to the embodiments of the invention are described below while referring to the diagrams. Like features may be designated with like reference symbols and repeated explanations may be omitted. The diagrams are shown enlarged for the sake of convenience, and the relative dimensions of features in the diagrams are not necessarily to scale.

FIG. 1 is a cross-sectional view showing an example of a first embodiment of the photomask blank of the invention. This photomask blank is a phase shift mask blank. The phase shift mask blank 511 has, on a transparent substrate 1, a phase shift film (film to be processed) 21 which is a film made of a silicon-containing material and is formed in contact with the transparent substrate 1, and a hardmask film 31 which is a film made of a chromium-containing material and is formed in contact with the phase shift film 21. The hardmask film 31 is composed of, in order from a side away from the transparent substrate 1, a first layer (top layer) 311, a second layer (middle layer) 312 and a third layer (bottom layer) 3.

Figure 2:
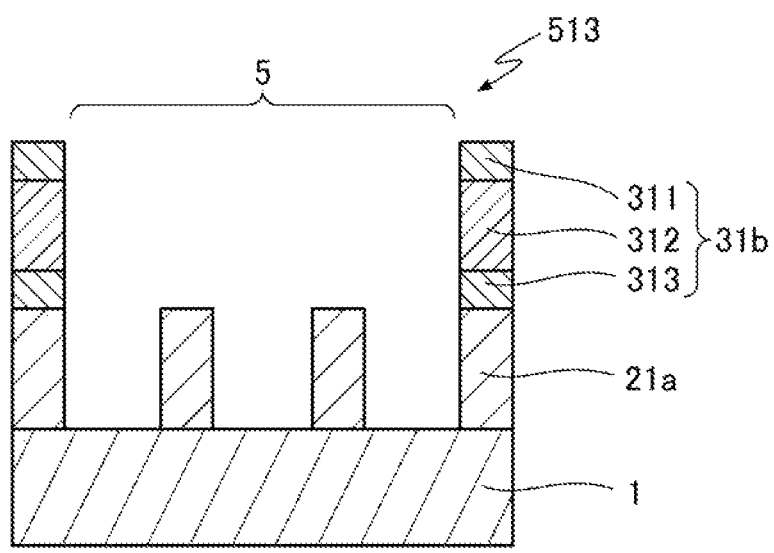
FIG. 2 is a cross-sectional view showing an example of a first embodiment (phase shift mask) of the photomask of the invention.

FIG. 2 is a cross-sectional view showing an example of a first embodiment of the photomask of the invention. This photomask is a phase shift mask. The phase shift mask 513 has, on a transparent substrate 1, a phase shift film pattern 21*a* which is a film made of a silicon-containing material and is formed in contact with the transparent substrate 1, and a light-shielding film pattern 31*b* which is a film made of a chromium-containing material and is formed in contact with the phase shift film pattern 21*a*, in a region located at an outer peripheral edge of the transparent substrate 1 where a circuit pattern is not formed, and has a circuit pattern formed inside an effective region 5. The light-shielding film pattern 31*b* is composed of, in order from a side away from the transparent substrate 1, a first layer (top layer) 311, a second layer (middle layer) 312 and a third layer (bottom layer) 313. The phase shift mask 513 shown in FIG. 2 can be manufactured from the phase shift mask blank 511 shown in FIG. 1.

The film made of the silicon-containing material may be a single-layer film, a multilayer film (e.g., a film composed of 2 to 4 layers), or a film having a gradient composition. The silicon-containing material is preferably a material that has a resistance to chlorine-based dry etching and is removable by fluorine-based dry etching. In this invention, fluorine-based dry etching is typically dry etching with a fluorine-containing etching gas such as $CF_4$ gas or $SF_6$ gas, and chlorine-based dry etching is typically dry etching with a chlorine and oxygen-containing etching gas such as a mixture of $Cl_2$ gas and $O_2$ gas. The silicon-containing material is preferably a material which contains silicon and does not contain a transition metal, or a material which contains a transition metal other than chromium (Me) and silicon and does not contain chromium.

The film material which contains silicon and does not contain a transition metal may be uncombined silicon (Si) or a silicon compound containing silicon (Si) and one or more selected from oxygen (O), nitrogen (N) and carbon (C). Examples of such materials include materials composed of silicon (Si), materials composed of silicon and oxygen (SiO), materials composed of silicon and nitrogen (SiN), materials composed of silicon, oxygen and nitrogen (SiON), materials composed of silicon and carbon (SiC), materials composed of silicon, oxygen and carbon (SiOC), materials composed of silicon, nitrogen and carbon (SiNC) and materials composed of silicon, oxygen, nitrogen and carbon (SiONC).

Film materials which contain a transition metal other than chromium (Me) and silicon and do not contain chromium may be transition metal (Me) silicon compounds which contain a transition metal (Me) and silicon (Si), or may be transition metal (Me) silicon compounds which contain a transition metal (Me), silicon (Si) and one or more selected from oxygen (O), nitrogen (N) and carbon (C). Examples of such materials include materials composed of a transition metal and silicon (MeSi), materials composed of a transition metal, silicon and oxygen (MeSiO), materials composed of a transition metal, silicon and nitrogen (MeSiN), materials composed of a transition metal, silicon, oxygen and nitrogen (MeSiON), materials composed of a transition metal, silicon and carbon (MeSiC), materials composed of a transition metal, silicon, oxygen and carbon (MeSiOC), materials composed of a transition metal, silicon, nitrogen and carbon (MeSiNC) and materials composed of a transition metal, silicon, oxygen, nitrogen and carbon (MeSiONC).

Here, the transition metal (Me) other than chromium is preferably one or more selected from molybdenum (Mo), tungsten (W), tantalum (Ta), titanium (Ti), zirconium (Zr) and hafnium (Hf). From the standpoint of the dry etch processability, molybdenum (Mo) is especially preferred. The material of the film made of a silicon-containing material may include hydrogen and the like.

In cases where the film to be processed is a film made of a tantalum-containing material, an optical film such as an absorption film that can be used in a reflective photomask is suitable as the film made of a tantalum-containing material. In this case, the reflective photomask blank and photomask have a reflection film formed on the substrate side of the absorption film. The absorption film and the reflection film may be made, respectively, an absorption film for absorbing extreme ultraviolet light and a reflection film for reflecting extreme ultraviolet light. The wavelength of extreme ultraviolet light is generally 13 to 14 nm. The reflection film is preferably a multilayer reflection film made of a plurality of layers.

In cases where the film made of a tantalum-containing material is an absorption film, the photomask blank is a reflective photomask blank (reflective mask blank), and a reflective photomask (reflective mask) is manufactured from the reflective photomask blank.

A reflective mask having a circuit pattern (photomask pattern)-containing absorption film pattern on a substrate can be manufactured from a reflective mask blank. It is preferable for the absorption film to have a thickness of at least 50 nm, especially at least 60 nm, and not more than 110 nm, especially not more than 100 nm. The reflection film preferably has a thickness of at least 200 nm, especially at least 220 nm, and not more than 340 nm, especially not more than 280 nm.

Figure 3:
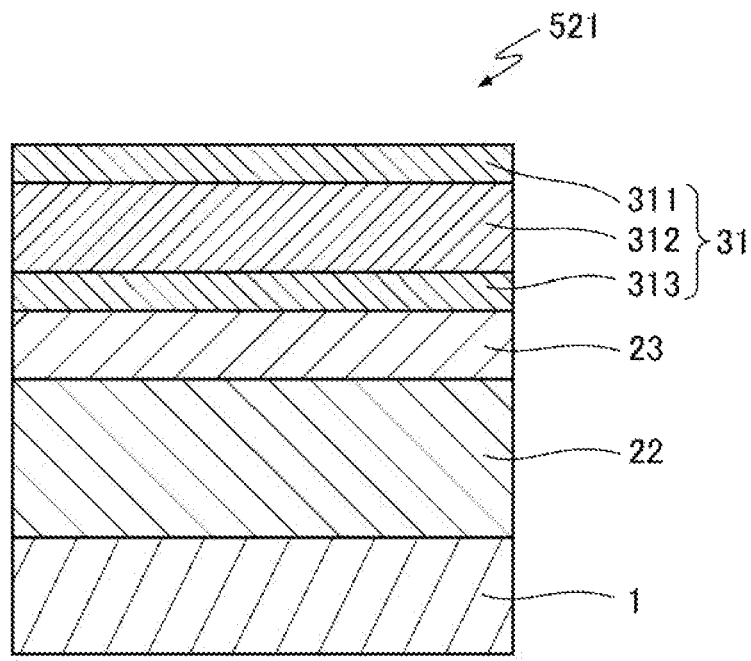
FIG. 3 is a cross-sectional view showing an example of a second embodiment (reflective mask blank) of the photomask blank of the invention.

FIG. 3 is a cross-sectional view showing an example of a second embodiment of the photomask blank of the invention. This photomask blank is a reflective mask blank. The reflective mask blank 521 has, in order on a substrate 1, a reflection film 22 formed in contact with the substrate 1, an absorption film (film to be processed) 23 that is formed in contact with the reflection film 22 and is a film made of a tantalum-containing material, and a hardmask film 31 that is formed in contact with the absorption film 23 and is a film made of a chromium-containing material. The hardmask film 31 consists of, in order from a side away from the substrate 1, a first layer (top layer) 311, a second layer (middle layer) 312 and a third layer (bottom layer) 313.

Figure 4:
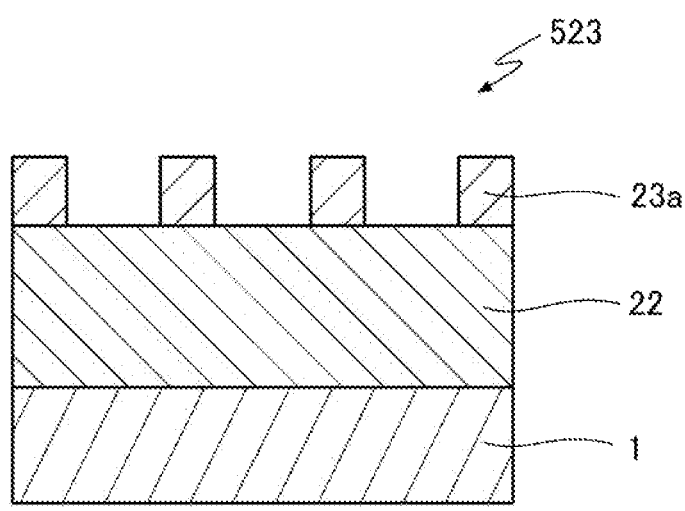
FIG. 4 is a cross-sectional view showing an example of a second embodiment (reflective mask) of the photomask of the invention.

FIG. 4 is a cross-sectional view showing an example of a second embodiment of the photomask of the invention. This photomask is a reflective mask. The reflective mask 523 has, on a transparent substrate 1, a reflection film 22 which is formed in contact with the substrate, and an absorption pattern 23a which is formed in contact with the reflection film 22 and is a film made of a tantalum-containing material. The reflective mask 523 shown in FIG. 4 can be manufactured from the reflective mask blank 521 shown in FIG. 3.

The film made of a tantalum-containing material may be a single-layer film, a multilayer film (a film having, for example, 2 to 4 layers), or a film having a gradient composition. The tantalum-containing material is preferably a material which can be removed by dry etching using a chlorine-based gas (e.g., $Cl_2$ gas) alone or a mixture of a chlorine-based gas (e.g., $Cl_2$ gas) and a fluorine-based gas (e.g., $CF_4$ gas or $SF_6$ gas) as the etching gas. Examples of the tantalum-containing material include uncombined tantalum (Ta), and tantalum compounds containing tantalum (Ta) and one or more selected from, for example, oxygen (O), nitrogen (N) and boron (B). Examples of such materials include materials composed of tantalum (Ta), materials composed of tantalum and oxygen (TaO), materials composed of tantalum and nitrogen (TaN), materials composed of tantalum and boron (TaB), materials composed of tantalum, boron and oxygen (TaBO) and materials composed of tantalum, boron and nitrogen (TaBN).

The material making up the reflection film is preferably a material which has a resistance to chlorine-based dry etching and which can be removed by fluorine-based dry etching. Examples of the materials making up the reflection film include molybdenum (Mo) and silicon (Si); a multilayer film of about 20 to 60 layers in which molybdenum layers and silicon layers are stacked in alternation is generally used. A protective film for protecting the reflection film may be formed between the reflection film and the absorption film. The protective film preferably has a thickness of at least 2 nm and not more than 20 nm. The material making up the protective film is exemplified by ruthenium (Ru).

In this invention, the film made of a chromium-containing material is a layered film having a three-layer structure consisting of, in order from the side away from the substrate, a first layer, a second layer and a third layer. In these first, second and third layers, the first and third layers are each made of chromium, oxygen and nitrogen-containing materials, and the second layer is made of a chromium, oxygen, nitrogen and carbon-containing material. The chromium-containing materials are preferably materials which have a resistance to fluorine-based dry etching and can be removed by chlorine-based dry etching. The chromium, oxygen and nitrogen-containing materials of the first and third layers preferably contain no silicon. The chromium, oxygen and nitrogen-containing materials of the first and third layers are preferably materials made of chromium (Cr), oxygen (O) and nitrogen (N), abbreviated below as CrON. The chromium, oxygen, nitrogen and carbon-containing material of the second layer also preferably contains no silicon. The chromium, oxygen, nitrogen and carbon-containing material of the second layer is preferably a material made of chromium (Cr), oxygen (O) and nitrogen (N), abbreviated below as CrONC.

An optical film such as a light-shielding film or an anti-reflective film in a transmissive photomask or a hardmask film which functions as an etching mask when etching a film made of a silicon-containing material that is in contact with the film made of a chromium-containing material is suitable as the film made of a chromium-containing material. When the film made of a chromium-containing material is a light-shielding film, each layer may be selected from a light-shielding layer and an anti-reflective layer; for example, the first layer may be an anti-reflective layer, the second layer may be a light-shielding layer, and the third layer may be an anti-reflective layer. It is suitable to have a film made of a chromium-containing material function as a hardmask film when etching the film made of a silicon-containing material, and to subsequently leave behind a portion thereof on the film made of a silicon-containing material. Specifically, when manufacturing a photomask, it is preferable to leave behind the film made of a chromium-containing material in a region located at the outer peripheral edge of the substrate where a circuit pattern of the film made of a silicon-containing material is not formed, and to use it as a light-shielding film.

It is suitable for the film made of a chromium-containing material to be an optical film such as the absorption film of a reflective photomask or a hardmask film that functions as an etching mask when etching a film made of a tantalum-containing material that is in contact with the film made of a chromium-containing material.

In the film made of a chromium-containing material in this invention, the composition of the first layer (top layer) which is the layer on the side away from the substrate has a chromium content of 40 atom % or less, an oxygen content of 50 atom % or more, and a nitrogen content of 10 atom % or less. The chromium content of the first layer is preferably 38 atom % or less, and is also preferably 30 atom % or more, especially 35 atom % or more. The oxygen content of the first layer is preferably 53 atom % or more, and is also preferably 60 atom % or less, especially 58 atom % or less. The nitrogen content of the first layer is preferably 8 atom % or less, and is also preferably 3 atom % or more, especially 5 atom % or more. The thickness of the first layer is 6 nm or less. The thickness of the first layer is preferably 2 nm or more.

When a photomask is manufactured from a photomask blank, the first layer is the layer that comes into direct contact with the cleaning solution and is also the layer in contact with the resist film. In exposure using a photomask, of the film made of a chromium-containing material, it is the layer located on the side where the exposure light enters; that is, the side away from the substrate. Therefore, it is desired that the first layer have a high chemical resistance to the cleaning solution, have a high adhesion to the resist film, and also not readily reflect the exposure light.

Compared to chromium oxide (CrO), chromium oxynitride (CrON) does not dissolve in a mixture of sulfuric acid and hydrogen peroxide or in an ammoniated solution (ammonia-peroxide mixture, APM), and is able to stably maintain its optical properties. Also, chromium oxynitride (CrON) has a lower reflectance to the exposure light than chromium nitride (CrN) and, during exposure using a photomask (when transferring a photomask pattern), can suppress reflection of the exposure light to the recipient material. It is therefore advantageous to use the film made of a chromium-containing material as a light-shielding film. Moreover, chromium oxynitride (CrON) has a good adhesion to the resist film. Also, compared with chromium nitride (CrN), chromium oxide (CrO) is good in that when the resist film is stripped from a film made of a chromium-containing material using a mixture of sulfuric acid and hydrogen peroxide, sulfate ions do not readily remain on the surface and so, even when the resist film is formed again, adhesion to the resist film is unlikely to worsen. For these reasons, the first layer is made of an oxygen and nitrogen-containing material and has the oxygen-rich composition indicated above with a relatively high oxygen content.

Because the first layer is in contact with the second layer, during formation of the first layer, a thinner first layer incurs the influence of oxygen in the second layer, which has a relatively high oxygen content, making it easy to impart the first layer with the above-described composition having a high oxygen content and a low nitrogen content. For this reason, the thickness of the first layer is set to 6 nm or less.

In the film made of a chromium-containing material according to this invention, the composition of the second layer (middle layer) which is the layer situated between the first and third layers has a chromium content of 40 atom % or less, an oxygen content of 30 atom % or more, a nitrogen content of 17 atom % or more and an oxygen content of 13 atom % or less. The chromium content of the second layer is preferably 39 atom % or less, and is also preferably 30 atom % or more, especially 32 atom % or more. The oxygen content of the second layer is preferably 33 atom % or more, and is also preferably 40 atom % or less, especially 38 atom % or less. The nitrogen content of the second layer is preferably 18 atom % or more, and is also preferably 24 atom % or less, especially 20 atom % or less. The carbon content of the second layer is preferably 12 atom % or less, and is also preferably 8 atom % or more, especially 9 atom % or more. The thickness of the second layer is 46 nm or more, and preferably 47 nm or more, and is also preferably 56 nm or less, especially 54 nm or less.

During the chlorine-based dry etching of the film made of a chromium-containing material, sufficient oxygen must be supplied from the film in order to aid in the plasma processing of a small space pattern. The second layer is thus made a layer having a relatively high oxygen content. Moreover, to increase the etch rate, it is effective to include carbon in the second layer so that the layer has the film density-lowering quality of chromium carbide (CrC). From this perspective, the second layer is made of a material containing carbon along with oxygen and is given the above-indicated composition having a relatively high oxygen content.

In addition, given the above-described constraints on the first layer and the subsequently described constraints on the third layer, in cases where it is necessary to ensure that the overall film made of a chromium-containing material has a higher optical density, the desired optical density is achieved by way of the second layer. From this perspective, the thickness of the second layer is set to 46 nm or more.

In the film made of a chromium-containing material according to the invention, the composition of the third layer (bottom layer), which is the layer on the substrate side, has a chromium content of 50 atom % or more, an oxygen content of 20 atom % or less and a nitrogen content of 30 atom % or more. The chromium content of the third layer is preferably 52 atom % or more, and is also preferably 60 atom % or less, especially 58 atom % or less. The oxygen content of the third layer is preferably 15 atom % or less, and is also preferably 5 atom % or more, especially 10 atom % or more. The nitrogen content of the third layer is preferably 34 atom % or more, and is also preferably 50 atom % or less, especially 40 atom % or less. The thickness of the third layer is preferably 4 nm or less, and is also preferably 2 nm or more.

A resist film is formed on the surface of the film made of a chromium-containing material. However, but when using an electron beam to write a pattern on the resist film, if the film made of a chromium-containing material has a high sheet resistance, the surface layer portion of the film made of a chromium-containing material is charged by the electron beam, causing misalignment of the electron beam irradiation position so that the electron beam does not irradiate the intended position. When this happens, a pattern does not form at the intended position, as a result of which the circuit of the device being fabricated does not correctly form, which causes device malfunction. Hence, it is preferable for the film made of a chromium-containing material to have a low sheet resistance. The first layer is made, for the above-indicated reasons, of a material containing chromium, oxygen and nitrogen, and has an oxygen-rich composition with a relatively high oxygen content; but chromium oxide (CrO) has a high sheet resistance compared with chromium nitride (CrN), and so the oxygen-rich first layer made of chromium oxynitride (CrON) has a relatively high sheet resistance. The second layer is made, for the above-indicated reasons, of a material containing chromium, oxygen, nitrogen and carbon, and has a composition with a relatively high oxygen content, but the second layer made of chromium oxynitride carbide (CrONC) also has a relatively high sheet resistance. Therefore, from the standpoint of the sheet resistance of the overall film made of a chromium-containing material, a third layer is provided in contact with the second layer, the third layer being made of a material containing oxygen and nitrogen and being given the above-indicated composition which is a composition having a relatively high nitrogen content.

Moreover, the third layer has a composition with an appropriately high nitrogen content compared with the first and second layers, but chromium nitride (CrN) has a lower etch rate in chlorine-based dry etching than chromium oxide (CrO), and the third layer made of chromium oxynitride (CrON), with its relatively high nitrogen content, has a relatively low etch rate. The more time that etching of the film made of a chromium-containing material takes, the thicker the resist film needs to be, and the thicker the resist film, the worse the resolution of the line pattern, especially the line pattern assist pattern. Thus, to shorten the etch time of the second layer, the thickness of the third layer is preferably 4 nm or less. In this way, the thickness of the resist film formed on the film made of a chromium-containing materials can be made appropriately thin.

The film made of a chromium-containing material has a sheet resistance such that the combined sheet resistance of the first and second layers, and preferably the combined sheet resistance of the first, second and third layers, is preferably 300 kΩ/□ or less, especially 200 kΩ/□ or less. Given the above-indicated characteristics of the first, second and third layers, it is possible for the film made of a chromium-containing material to have such a sheet resistance.

In cases where the film made of a chromium-containing material is a light-shielding film, particularly when, during photomask production, it is left behind as a light-shielding film in a region located at an outer peripheral edge of the substrate where the circuit pattern of the film made of a silicon-containing material is not formed, the combined optical density (OD) of the film made of a silicon-containing material that is a phase shift film and the light-shielding film to the exposure light, such as light having a wavelength of 250 nm or less, especially light having a wavelength of 200 nm or less such as an ArF excimer laser (193 nm) or a $F_2$ laser (wavelength, 157 nm), is set to more than 2.0, and especially 2.5 or more. For example, when the film made of a silicon-containing material is a phase shift film having a transmittance to the exposure light of 6% or more and 30% or less (an optical density of 0.53 or more and 1.22 or less), in order to have the combined optical density of the phase shift film and the light-shielding film be 3 or more, it is necessary for the optical density of the film made of a chromium-containing material (the sum for the first, second and third films) to be 1.78 or more. Given the above-indicated characteristics of the first, second and third layers, it is possible for the film made of a chromium-containing material to have such an optical density. The upper limit in the optical density to the exposure light of the film made of a chromium-containing material (the sum for the first, second and third films) is generally 3.2 or less.

The thickness of the film made of a chromium-containing material (the sum of the thicknesses of the first, second and third layers) is preferably 44 nm or more, especially 48 nm or more, and is preferably 88 nm or less, especially 85 nm or less. Particularly in cases where, during photomask production, the film made of a chromium-containing material is left behind as a light-shielding film in a region located at an outer peripheral edge of the substrate where the circuit pattern of the film made of a silicon-containing material is not formed, the thickness of the film made of a chromium-containing material is preferably 48 nm or more and 85 nm or less.

In both the first layer and the third layer, carbon may be present in a small amount, the carbon content being preferably less than 5 atom %, more preferably 3 atom % or less, and even more preferably 2 atom % or less. Materials containing chromium, oxygen, nitrogen and carbon in the first and third layer are exemplified by materials composed of chromium, oxygen, nitrogen and carbon (CrONC).

The photomask blank of the invention may additionally have, on the side of the film made of a chromium-containing material that is away from the substrate, a resist film. The resist film may be an electron beam resist for patterning with an electron beam or a photoresist for patterning with light, and is preferably a chemically amplified resist. The chemically amplified resist may be a positive resist or a negative resist. Examples include resists containing a base resin such as a hydroxystyrene resin or a (meth)acrylate resin, and an acid generator, and optionally including also, for example, a crosslinking agent, a quencher and a surfactant. The resist film has a thickness which, when during fine pattern formation, to keep the resist pattern from collapsing in the development step or the rinsing step after development, is preferably 50 nm or more, especially 70 nm or more, and is preferably 200 nm or less, especially 150 nm or less.

Figure 5:
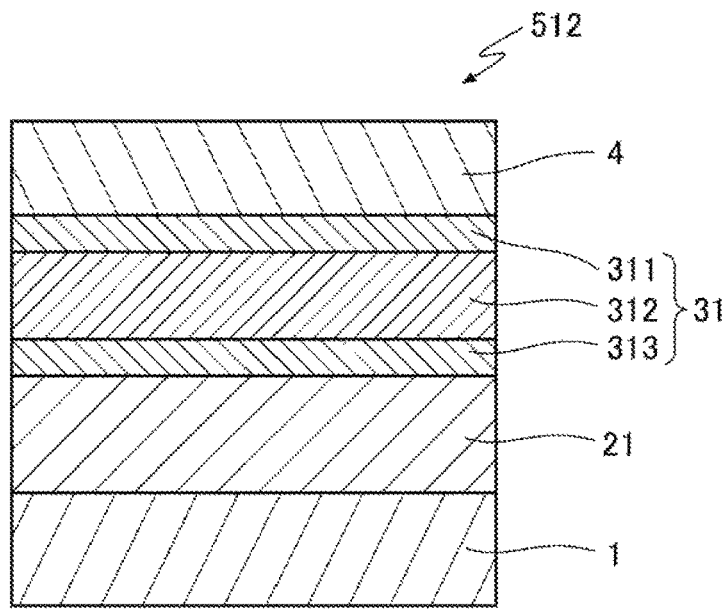
FIG. 5 is a cross-sectional view showing another example of the first embodiment (phase shift mask blank) of the photomask blank of the invention.

FIG. 5 is a cross-sectional view showing another example of the first embodiment of the photomask blank of the invention. This photomask blank is a phase shift mask blank. This phase shift mask blank 512 has a resist film 4 formed in contact with the hardmask film 31 of the photomask blank shown in FIG. 1. The phase shift mask 513 shown in FIG. 2 can also be manufactured from the phase shift mask blank 512 shown in FIG. 5.

Figure 6:
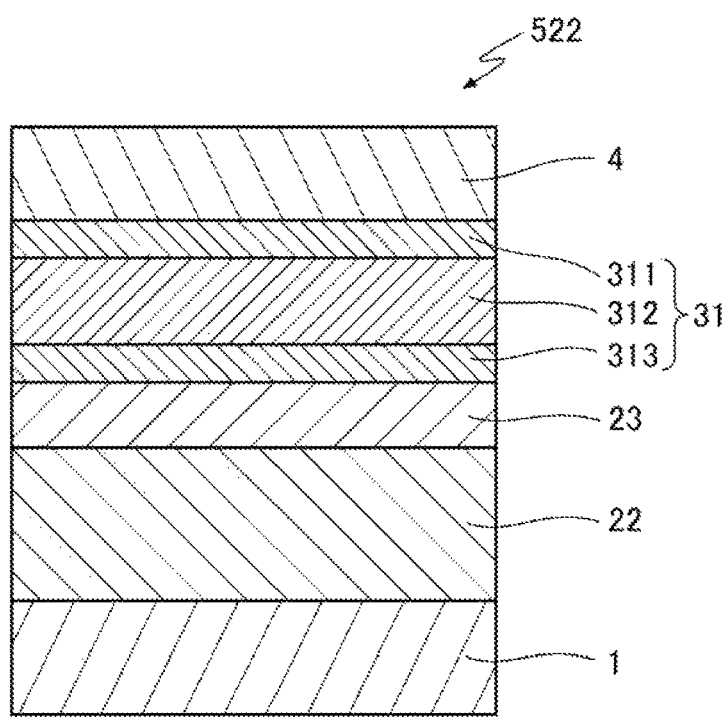
FIG. 6 is a cross-sectional view showing another example of the second embodiment (reflective mask blank) of the photomask blank of the invention.

FIG. 6 is a cross-sectional view showing another example of the second embodiment of the photomask blank of the invention. This photomask blank is a reflective mask blank. This reflective mask blank 522 has a resist film 4 formed in contact with the hardmask film 31 of the photomask blank shown in FIG. 3. The reflective mask 523 shown in FIG. 4 can also be manufactured from the reflective mask blank 522 shown in FIG. 6.

Formation of the film made of a chromium-containing material, the film made of a silicon-containing material, the film made of a tantalum-containing material and the reflection film in the invention is not particularly limited, However, formation by a sputtering process is preferred because the controllability is good and films having the desired properties are easy to form. Sputtering techniques that may be employed include, without particular limitation, CD sputtering and RF sputtering.

When forming, as the film made of a chromium-containing material, a film that contains chromium and does not contain silicon, a chromium target may be used as the sputtering target. When forming, as the film made of a silicon-containing material, a film that contains silicon and does not contain a transition metal, a silicon (Si) target may be used as the sputtering target. Also, when forming, as the film made of a silicon-containing material, a film that contains a transition metal other than chromium (Me) and silicon and does not contain chromium, a target containing silicon and a transition metal other than chromium (Me) may be used as the sputtering target. In such cases, co-sputtering may be carried out using a silicon (Si) target and a transition metal other than chromium (Me) target, using a plurality of targets that contain a transition metal other than chromium (Me) and silicon and have differing compositions (some or all of the constituent elements being different, or the constituent elements being the same but their concentrations being different), or using a silicon (Si) target or transition metal other than chromium (Me) target and a target containing a transition metal other than chromium (Me) and silicon. When forming a film made of a tantalum-containing material, a tantalum (Ta) target, a target composed of tantalum and boron (TaB) or the like may be used. In addition, when a forming a reflection film, a molybdenum (Mo) target and a silicon (Si) target can generally be used; and when forming a protective film, a ruthenium (Ru) target can generally be used.

The power applied to the sputtering target may be suitably set according to, for example, the size of the sputtering target, the cooling efficiency, and the ease of controlling film formation. Generally, the power per unit surface area of the sputtering surface on the sputtering target may be set to from 0.1 to 10 W/cm$^2$.

When forming a film of a material consisting solely of silicon or consisting solely of silicon and a transition metal, a noble gas such as helium gas (He), neon gas (Ne) or argon gas (Ar) may be used alone as the sputtering gas. On the other hand, when forming a film of a material which includes oxygen, nitrogen or carbon, sputtering is preferably reactive sputtering. A noble gas such as helium gas (He), neon gas (Ne) or argon gas (Ar) and a reactive gas may be used together as the sputtering gas. For example, when forming a film of an oxygen-containing material, oxygen gas ($O_2$ gas) may be used as the reactive gas; when forming a film of a nitrogen-containing material, nitrogen gas ($N_2$ gas) may be used as the reactive gas. When forming a film of a material containing both nitrogen and oxygen, oxygen gas ($O_2$ gas) and nitrogen gas ($N_2$) may be used together as the reactive gas, or a nitrogen oxide gas such as nitrogen monoxide gas (NO gas), nitrogen dioxide gas ($NO_2$ gas) or nitrous oxide gas ($N_2O$) gas may be used. When forming a film of a carbon-containing material, a carbon-containing gas such as methane gas ($CH_4$), carbon monoxide gas (CO gas) or carbon dioxide gas ($CO_2$ gas) may be used as the reactive gas.

The pressure during film formation should be suitably set while taking into account, for example, film stress, chemical resistance and cleaning resistance. Generally, by setting the pressure to 0.01 Pa or more, especially 0.03 Pa or more, and 1 Pa or less, especially 0.3 Pa or less, the chemical resistance rises. The flow rate of each gas should be suitably set so as to give the desired composition, and generally may be set to from 0.1 to 100 sccm.

In the course of manufacturing a photomask blank, heat treatment may be applied to the substrate or to the substrate and the films formed on the substrate. Heat treatment methods that may be used include infrared heating and resistance heating. The treatment conditions too are not particularly limited. Heat treatment may be carried out, for example, in an oxygen-containing gas atmosphere. The concentration of the oxygen-containing gas is not particularly limited; for example, in the case of oxygen gas ($O_2$ gas), the concentration may be set to from 1 to 100 vol %. The heat treatment temperature is preferably set to 200° C. or more, and especially 400° C. or more. In the course of manufacturing the photomask blank, ozone treatment, plasma treatment or the like may be applied to the films formed on the substrate, especially the film made of a chromium-containing material. The treatment conditions in such cases also are not particularly limited. Either of these treatments may be applied for the purpose of increasing the oxygen concentration in the surface portion of the film, in which case the treatment conditions may be suitably adjusted so as to arrive at the intended oxygen concentration. When the film is formed by sputtering, it is also possible to increase the oxygen concentration in the surface portion of the film by adjusting the ratio between the noble gas and the oxygen-containing gas (oxidizing gas), such as oxygen gas ($O_2$ gas), carbon monoxide gas (CO gas) or carbon dioxide gas ($CO_2$ gas), within the sputtering gas.

In the course of manufacturing a photomask blank, cleaning treatment may be carried out in order to remove particles present on the substrate or on the surface of a film formed on the substrate. Cleaning may be carried out using one or both of ultrapure water and functional water that is ultrapure water containing ozone gas, hydrogen gas or the like. After cleaning with ultrapure water containing a surfactant, further cleaning may be carried out using one or both of ultrapure water and functional water. If necessary, cleaning may be carried out under ultrasonic irradiation, and UV light irradiation may be combined as well.

When forming a resist film on the photomask blank of the invention, a known method may be employed without particular limitation as the method of applying the resist film.

Figure 7A:
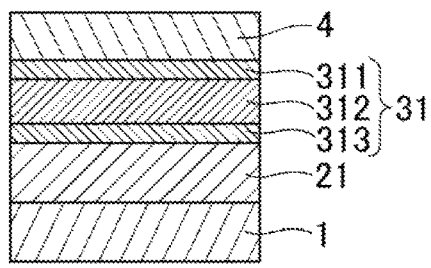
FIGS. 7(A) to 7(I) are cross-sectional views showing steps in the manufacture of a phase shift mask from the phase shift mask blank of the first embodiment of the invention.
Figure 7B:
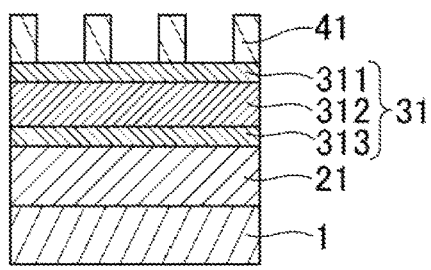
Figure 7C:
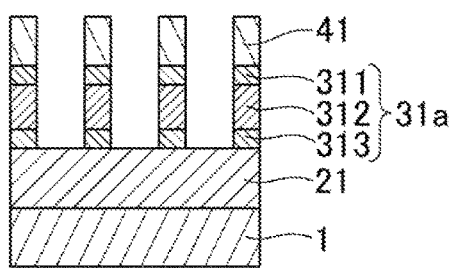
Figure 7D:
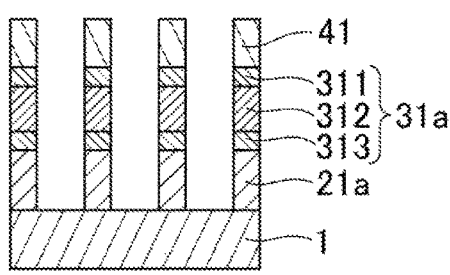

A photomask can be manufactured from the photomask blank of the invention. FIG. 7 shows cross-sectional views illustrating the steps for manufacturing a phase shift mask from the phase shift mask blank of the first embodiment of the invention. In this case, first, as shown in FIG. 7(A), a resist film (the film thickness being preferably 50 nm or more and 200 nm or less) 4 is formed on a side of a film made of a chromium-containing material (hardmask film 31) that is away from a transparent substrate 1 (step (A)). Next, as shown in FIG. 7(B), the resist film 4 is patterned, forming a resist pattern 41 (step (C)). Next, as shown in FIG. 7(C), using the resist pattern 41 as the etching mask, the film made of a chromium-containing material (hardmask film 31), which consists of a first layer 311, a second layer 312 and a third layer 313, is patterned by chlorine-based dry etching, forming a pattern in the film made of a chromium-containing material (hardmask film pattern 31a) (step (D)). Next, as shown in FIG. 7(D), using the pattern in the film made of a chromium-containing material (hardmask film pattern 31a) as the etching mask, a film made of a silicon-containing material (phase shift film 21) is patterned by fluorine-based dry etching, forming a pattern in the film made of a silicon-containing material (phase shift film pattern 21a) (step (E)). Next, where necessary, by suitably removing the remaining resist pattern 41 and the pattern in the film made of a chromium-containing material (hardmask film pattern 31a), a photomask (phase shift mask) can be obtained.

Figure 7E:
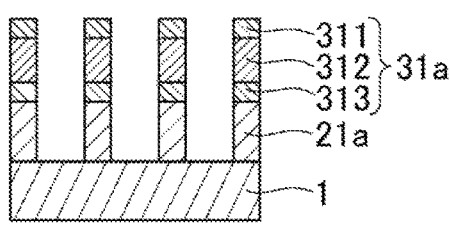
Figure 7F:
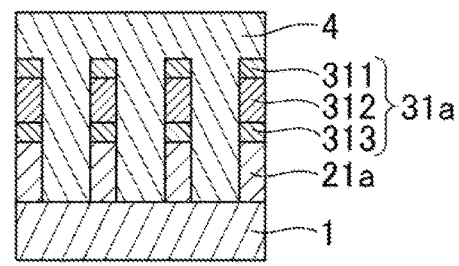
Figure 7G:
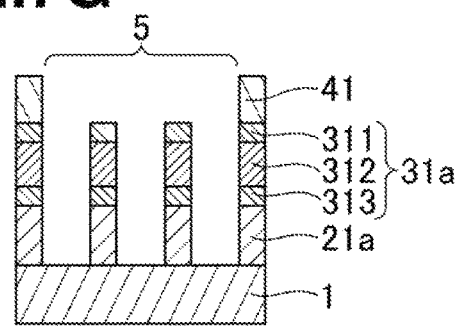
Figure 7H:
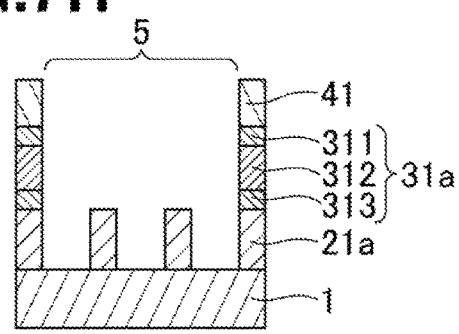
Figure 7I:
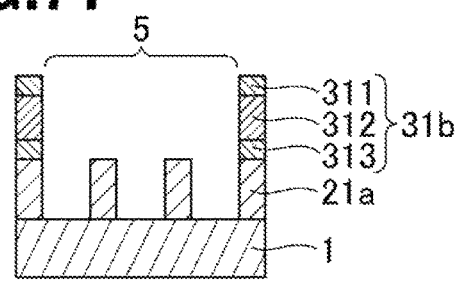

In cases where the film made of a chromium-containing material remains at the outer peripheral edge of the transparent substrate that is a region where a circuit pattern is not formed in the film made of a silicon-containing material, following step (E), a portion of the film made of a chromium-containing material located at the outer peripheral edge of the transparent substrate that is a region where a circuit pattern is not formed in the film made of a silicon-containing material is left and the pattern in the film made of a chromium-containing material in areas other than at the outer peripheral edge is removed by dry etching with an oxygen-containing chlorine-based gas (step (F)). In this case, in step (F), following step (E), first, as shown in FIG. 7(E), the remaining resist pattern 41 is removed. Next, as shown in FIG. 7(F), a new resist film 4 is formed on the transparent substrate 1 and the pattern in the film made of chromium-containing material (hardmask film pattern 31a). Next, as shown in FIG. 7(G), the resist film 4 is patterned in such a way that a portion of the resist film 4 located at the outer peripheral edge of the transparent substrate that is a region where a circuit pattern is not formed in the film made of a silicon-containing material (phase shift film pattern 21a) remains, thereby forming the resist pattern 41. Next, as shown in FIG. 7(H), the pattern (hardmask film pattern 31a) in the film made of a chromium-containing material within the circuit pattern (mask pattern) forming region is removed by chlorine-based dry etching using the resist pattern 41 as the etching mask. Finally, as shown in FIG. 7(I), the remaining resist pattern 41 is removed, thereby forming a circuit pattern (phase shift film pattern 21a) in the film made of a silicon-containing material within the effective region 5 and enabling a photomask (phase shift mask) to be obtained in which a portion of the light-shielding film pattern 31b located at the outer peripheral edge of the transparent substrate that is a region where a circuit pattern is not formed in the film made of a silicon-containing material remains behind.

Figure 8A:
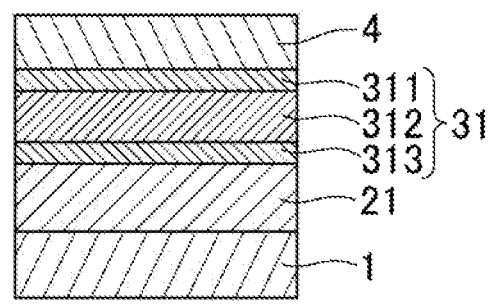
FIGS. 8(A) to 8(C) are cross-sectional views showing the step (B) procedure in the steps for manufacturing a phase shift mask from the phase shift mask blank of the first embodiment of the invention.
Figure 8B:
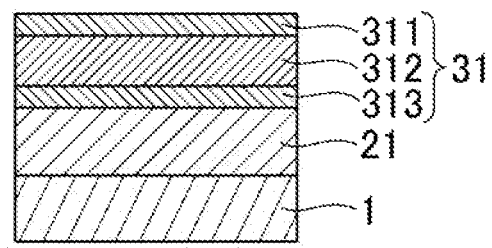
Figure 8C:
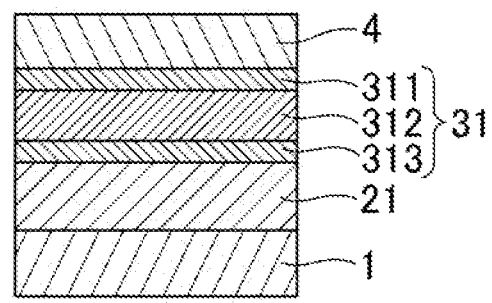

In the photomask blank of the invention, prior to steps (A) and (C), the step of stripping the resist film formed in step (A) using a mixture of sulfuric acid and hydrogen peroxide (sulfuric peroxide mixture, SPM), and newly forming a resist film (preferably having a thickness of 50 nm or more and 200 nm or less) on the side of the exposed film made of a chromium-containing material away from the transparent substrate (step (B)) may be carried out. FIG. 8 shows cross-sectional views illustrating the procedure when step (B) is carried out on the phase shift mask blank of the first embodiment of the invention. In this case, first, from a state in which, as shown in FIG. 8(A), a resist film 4 has been formed in step (A) on the side of the film made of a chromium-containing material (hardmask film 31) away from the transparent substrate 1, as shown in FIG. 8(B), the resist film 4 is stripped using a mixture of sulfuric acid and hydrogen peroxide. Next, as shown in FIG. 8C, a resist film 4 is newly formed on the side of the film made of a chromium-containing material (hardmask film 31) away from the transparent substrate 1. Where necessary, step (B) may be carried out two or more times.

The inventive method of manufacturing a photomask from a photomask blank has been described using as an example, in FIGS. 7 and 8, the manufacture of a phase shift mask from a phase shift mask blank. However, in cases where a reflective mask is to be manufactured from a reflective mask blank, a reflective mask having a reflection film and an absorption film pattern can be manufactured from a reflective mask blank having a reflection film and an absorption film by selecting the etching conditions according to the etching properties of each film and forming an absorption film pattern by a method known to the art.

In photolithography for forming, on a substrate to be processed, a pattern having a half pitch of 50 nm or less, preferably 30 nm or less, more preferably 20 nm or less, and even more preferably 10 nm or less, the photomask of the invention is particularly effective in exposure that transfers a pattern to the photoresist film formed on the substrate to be processed using exposure light having a wavelength of 250 nm or less, especially 200 nm or less, such as an ArF excimer laser (wavelength, 193 nm) or a $F_2$ laser (wavelength, 157 nm), or using extreme ultraviolet light having a wavelength of 13 to 14 nm.

In pattern exposure using the photomask of the invention, a pattern in the photomask manufactured from a photomask blank is irradiated with exposure light, transferring the photomask pattern to a photoresist film—the target of exposure to the photomask pattern—on a substrate to be processed. Exposure light irradiation may be exposure under dry conditions or may be immersion exposure, and can be suitably used particularly in cases where the photomask pattern is exposed by the immersion exposure of a 300 mm or larger wafer as the substrate to be processed.

EXAMPLES

The invention is described more fully below by way of Examples and Comparative Examples, although these Examples do not limit the invention.

Example 1

A photomask blank (halftone phase shift mask blank) was manufactured by forming, as successive layers on a transparent substrate made of quartz and having a size of 152 mm square and a thickness of about 6 mm: a phase shift film (halftone phase shift film) as the film made of a silicon-containing material, and a hardmask film as the film made of a chromium-containing material.

First, a MoSi-based phase shift film (thickness, 70 nm) which was made of MoSiN and had a phase difference of 177 degrees and a transmittance of 6% (optical density, 1.2) to 193 nm wavelength light was formed as a single-layer film on the transparent substrate by carrying out sputtering using a molybdenum target and a silicon target as the targets and adjusting the power applied to these targets, and using also argon gas and nitrogen gas as the sputtering gases, which sputtering was carried out in an atmosphere of these gases.

Next, a hardmask film composed of a first layer, second layer and third layer, the first layer being made of chromium oxynitride (CrON), the second layer being made of chromium oxynitride carbide (CrONC) and the third layer being made of chromium oxynitride (CrON), was formed on the phase shift film by carrying out sputtering in the order of, from the side away from the transparent substrate, the third layer (bottom layer), second layer (middle layer) and first layer (top layer) by carrying sputtering using a chromium target as the target and adjusting the power applied to the target, and using also argon gas, oxygen gas and nitrogen gas as the sputtering gases and adjusting the proportions of the sputtering gases, which sputtering was carried out in an atmosphere of these gases. The composition and thickness of each layer of the hardmask film and the optical density to 193 nm wavelength light of the overall hardmask film are shown in Table 1. Here and below, compositions were measured using the K-Alpha x-ray photoelectron spectrometer from Thermo Fisher Scientific KK, film (layer) thicknesses were measured using the P-16+ stylus profilometer from KLA-Tencor Corporation, and optical densities were measured using the Solid Spec-3700 UV-Vis-NIR spectrometer from Shimadzu Corporation.

Next, the negative-working chemically amplified E-beam resist SEBN3015 (Shin-Etsu Chemical Co., Ltd.) was spin-coated onto the hardmask film to form a resist film having a thickness of 150 nm, giving a photomask blank having a resist layer such as is shown in FIG. 5.

Comparative Example 1

Aside from changing the compositions and thicknesses of the first, second and third layers of the hardmask film in such a way that the second layer of the hardmask film was made of chromium oxynitride (CrON) instead of chromium oxynitride carbide (CrONC) and the optical density of the overall hardmask film was the same as in Example 1, a phase shift film and a hardmask film were formed on a transparent substrate in the same way as in Example 1 to give a photomask blank without a resist film. In addition, a resist film was formed on the hardmask film, giving a photomask blank having a resist film. The composition and thickness of each layer of the hardmask film and the optical density to 193 nm wavelength light of the overall hardmask film are shown in Table 1.

Example 2

In order to evaluate the resolution limit of a fine pattern comparable to a line pattern assist pattern, the photomask blank having a resist film obtained in Example 1 was used to manufacture a photomask (halftone phase shift mask) like that shown in FIG. 2 in accordance with the steps shown in FIG. 7.

First, a photomask blank having a resist film was furnished (FIG. 7(A)). Next, using an electron beam lithography system, a total of 200,000 isolated patterns having a long side dimension of 140 nm and differing short side dimensions that were varied from 20 nm to 100 nm in 2 nm increments were written as a test pattern comparable to a line pattern assist pattern at a dose of 35 µC/cm$^2$. This was followed by 14 minutes of heat treatment at 110° C. (PEB: Post Exposure Bake) using a heat treatment system. Next, 100 seconds of developing treatment was carried out by puddle development, thereby forming a resist pattern (FIG. 7(B)). Chlorine-based dry etching was then carried out on the hardmask film using an oxygen gas-containing chlorine-based gas under the conditions shown below to form a hardmask film pattern (FIG. 7(C)). Fluorine-based dry etching was then carried out on the phase shift film using a fluorine-based gas under the conditions shown below to give a phase shift film pattern (FIG. 7(D)).

<Chlorine-Based Dry Etching Conditions>
  Apparatus: inductively coupled plasma (ICP) system
  Gas: $Cl_2$ gas+$O_2$ gas
  Gas pressure: 3.0 mTorr (0.40 Pa)
  ICP power: 350 W <Fluorine-Based Dry Etching Conditions>
  Apparatus: ICP
  Gas: $SF_6$ gas+He gas
  Gas pressure: 4.0 mTorr (0.53 Pa)
  ICP power: 400 W Next, the resist pattern was stripped by cleaning with sulfuric peroxide (this refers, here and below, to a mixture of sulfuric acid and hydrogen peroxide (sulfuric oxide: hydrogen peroxide=3:1)) (FIG. 7(E)). A resist film was then formed by spin-coating the resist for laser lithography IP3000 (Tokyo Ohka Kogyo Co., Ltd.) onto the transparent substrate and the hardmask film pattern (FIG. 7(F)). Next, using a laser lithography system, the effective region which includes the phase shift film diffraction pattern was written in such a way as to leave behind the resist film in areas located at the outer peripheral edge of the transparent substrate. Twenty minutes of heat treatment at 110° C. (PEB) was subsequently carried out using a heat treatment system. Next, 200 seconds of developing treatment was carried out by spray development, thereby forming a resist pattern (FIG. 7(G)). Chlorine-based dry etching was then carried out on the hardmask film pattern under the above conditions using an oxygen gas-containing chlorine-based gas, thereby stripping off the hardmask film pattern (FIG. 7(H)). The resist pattern was then stripped by washing with sulfuric peroxide (FIG. 7(I)), giving a photomask.

Next, the resolution limit of a test pattern on the resulting photomask was evaluated using a visual inspection system. Pattern disappearance, pattern collapse and poor pattern shape were evaluated for all the isolated patterns set to a long side dimension of 140 nm and a short side dimension that was varied from 20 nm to 100 nm in 2 nm increments. Isolated patterns for which pattern disappearance, pattern collapse or poor pattern shape was detected by the visual inspection system were regarded as defective, and the minimum short side dimension at which there were no isolated patterns with detected defects was taken to be the resolution limit. The results are shown in Table 2.

Comparative Example 2

In order to evaluate the resolution limit of a fine pattern comparable to a line pattern assist pattern, the photomask blank having a resist film obtained in Comparative Example 1 was used to manufacture a photomask (halftone phase shift mask) in the same way as in Example 2 in accordance with the steps shown in FIG. 7, and the resolution limit of the fine pattern was evaluated. The evaluation results are shown in Table 2.

As shown in Table 2, the phase shift mask blank in Example 1, which is a photomask blank according to the present invention, compared with the phase shift mask blank in Comparative Example 1, has a line pattern resolution limit that achieves a finer linewidth and was thus confirmed to be superior in terms of resolution. This is presumably because the first layer of the hardmask film in the photomask blank of the invention provides a good adhesion to the resist film.

Example 3

In order to evaluate, based on the resolution limit of a fine pattern comparable to a line pattern assist pattern, the effects associated with stripping a resist film formed on the film made of a chromium-containing material, a photomask (halftone phase shift mask) like that shown in FIG. 2 was manufactured in accordance with the steps shown in FIGS. 8 and 7 using the photomask blank having a resist film obtained in Example 1.

First, the photomask blank having a resist film was furnished (FIG. 8(A)). Next, the resist film was stripped by 12 minutes of cleaning with sulfuric peroxide. Then, to neutralize residual sulfate ions on the surface of the hardmask film (first layer), 15 minutes of rinsing was carried out with an ammoniated solution (ammonia-hydrogen peroxide mixture, APM), followed by 5 minutes of dry spin rinsing to reduce the amount of ammoniated solution from the surface of the hardmask film (first layer) (FIG. 8(B)). The negative-working chemically amplified electron-beam resist SEBN3015 (Shin-Etsu Chemical Co., Ltd.) was then spin-coated onto the hardmask film, forming a 150 nm thick resist film (FIGS. 8(C) and 7(A)).

Next, using an electron beam lithography system, a total of 200,000 isolated patterns having a long side dimension of 140 nm and differing short side dimensions that were varied from 20 nm to 100 nm in 2 nm increments were written as a test pattern corresponding to a line pattern assist pattern at a dose of 35 $\mu C/cm^2$. This was followed by 14 minutes of heat treatment at 110° C. (PEB) using a heat treatment system. Next, 100 seconds of developing treatment was carried out by puddle development, thereby forming a resist pattern (FIG. 7(B)). Chlorine-based dry etching was then carried out on the hardmask film using an oxygen gas-containing chlorine-based gas under the same conditions as in Example 1 to form a hardmask film pattern (FIG. 7(C)). Fluorine-based dry etching was then carried out on the phase shift film using a fluorine-based gas under the same conditions as in Example 1 to give a phase shift film pattern (FIG. 7(D)).

Next, the resist pattern was stripped by cleaning with sulfuric peroxide (FIG. 7(E)). A resist film was then formed by spin-coating the resist for laser lithography IP3000 (Tokyo Ohka Kogyo Co., Ltd.) onto the transparent substrate and the hardmask film pattern (FIG. 7(F)). Next, using a laser lithography system, the effective region which includes the phase shift film diffraction pattern was written in such a way as to leave behind the resist film in areas located at the outer peripheral edge of the transparent substrate. Twenty minutes of heat treatment at 110° C. (PEB) was subsequently carried out using a heat treatment system. Next, 200 seconds of developing treatment was carried out by spray development, thereby forming a resist pattern (FIG. 7(G)). Chlorine-based dry etching was then carried out on the hardmask film pattern under the same conditions as in Example 1 using an oxygen gas-containing chlorine-based gas, thereby stripping off the hardmask film pattern (FIG. 7(H)). The resist pattern was then stripped by washing with sulfuric peroxide (FIG. 7(I)), giving a photomask.

Next, the resolution limit of a test pattern on the resulting photomask was evaluated using a visual inspection system. Pattern disappearance, pattern collapse and poor pattern shape were evaluated for all the isolated patterns set to a long side dimension of 140 nm and a short side dimension that was varied from 20 nm to 100 nm in 2 nm increments. Isolated patterns for which a pattern disappearance, pattern collapse or poor pattern shape was detected by the visual inspection system were regarded as defective, and the minimum short side dimension at which there were no isolated patterns with detected defects was taken to be the resolution limit. The results are shown in Table 2.

Comparative Example 3

In order to evaluate, based on the resolution limit of a fine pattern comparable to a line pattern assist pattern, the effects associated with stripping of a resist film formed on the film made of a chromium-containing material, the photomask blank having a resist film obtained in Comparative Example 1 was used to manufacture a photomask (halftone phase shift mask) in the same way as in Example 3 in accordance with the steps shown in FIGS. 8 and 7, and the resolution limit of the fine pattern was evaluated. The evaluation results are shown in Table 2.

As shown in Table 2, the phase shift mask blank of Comparative Example 1 was adversely affected by sulfuric acid cleaning, resulting in a worsening of the line pattern resolution limit. By contrast, the phase shift mask blank of Example 1, which is a photomask blank according to the invention, was not adversely affected by sulfuric acid cleaning and it was thus confirmed that a resolution limit superior to that of the phase shift mask blank of Comparative Example 1 is maintained even after sulfuric acid cleaning. This is presumably because the first layer of the hardmask film on the photomask blank of the invention has a composition which does not readily react with sulfuric acid, sulfate ions tend not to remain behind on the surface of the first layer, and a good adhesion to the resist film can be maintained even after sulfuric acid cleaning.

Example 4

In order to evaluate CD linearity, the photomask blank having a resist film obtained in Example 1 was used to manufacture, in the same way as in Example 3 and in accordance with the steps shown in FIGS. 8 and 7, a photomask (halftone phase shift mask) like that shown in FIG. 2.

Next, the CD linearity of a test pattern on the resulting photomask was evaluated by measuring the sizes for all space patterns which have a long side dimension of 10 µm and have short side dimensions set to sizes that are varied by intervals of 5 nm from 800 nm to 50 nm. The evaluation results are shown in Table 3. Here and below, a scanning electron microscope for measuring pattern lengths (LWM 9000, from Advantest Corporation) was used to measure the sizes of the space patterns.

Comparative Example 4

In order to evaluate the CD linearity, the photomask blank having a resist film obtained in Comparative Example 1 was used to manufacture a photomask (halftone phase shift mask) in the same way as in Example 4 in accordance with the steps shown in FIGS. 8 and 7, and the CD linearity was evaluated. The evaluation results are shown in Table 3.

As shown in Table 3, the CD linearity of the phase shift mask blank of Example 1, which was a photomask blank according to the invention, was confirmed to be superior to the CD linearity of the phase shift mask blank of Comparative Example 1. This is presumably because the chromium-containing material of the second layer of the hardmask film on the photomask blank of the invention contains oxygen and carbon. By including carbon, the chromium-containing material has a smaller film density, so that etching proceeds more readily. In addition, the chromium-containing material, by containing a relatively high content of oxygen, enables the film to more readily supply oxygen to the plasma so that etching is promoted, as a result of which a good CD linearity can be obtained even in a small space pattern.

TABLE 1

|  |  | Chromium | Oxygen | Nitrogen | Carbon | Thickness (nm) | Optical density |
|---|---|---|---|---|---|---|---|
|  |  |  | Content (atom %) |  |  |  |  |
| Example 1 | First layer | 37 | 56 | 7 | 0 | 5 | 1.8 |
|  | Second layer | 38 | 34 | 18 | 10 | 48 |  |
|  | Third layer | 52 | 12 | 36 | 0 | 3 |  |
| Comparative Example 1 | First layer | 42 | 46 | 12 | 0 | 10 | 1.8 |
|  | Second layer | 52 | 12 | 36 | 0 | 4 |  |
|  | Third layer | 37 | 55 | 8 | 0 | 20 |  |

TABLE 2

| Photomask blank | Resolution limit of isolated line patterns | | Resolution limit difference |
|---|---|---|---|
|  | No sulfuric-peroxide cleaning | Sulfuric peroxide cleaning |  |
| Example 1 | 36 nm (Example 2) | 36 nm (Example 3) | 0 nm |
| Comparative Example 1 | 46 nm (Comp. Ex. 2) | 56 nm (Comp. Ex. 3) | 10 nm |

TABLE 3

| Photomask blank | CD linearity range (delta CD difference of design CD from 800 nm to 50 nm) | CD linearity difference |
|---|---|---|
| Example 1 | 8.9 nm | 10.8 nm |
| Comparative Example 1 | 19.7 nm |  |

REFERENCE SIGNS LIST

1 Substrate (transparent quartz)
21 Film made of silicon-containing material (phase shift film)
21a Pattern of film made of silicon-containing material (phase shift film pattern)
22 Reflection film
23 Film made of tantalum-containing material (absorption film)
23a Absorption film pattern
31 Film made of chromium-containing material (hardmask film)
31a Pattern of film made of chromium-containing material (hardmask film pattern)
31b Pattern of film made of chromium-containing material (light-shielding film pattern)
311 First layer (top layer)
312 Second layer (middle layer)
313 Third layer (bottom layer)
4 Resist film
41 Resist pattern
5 Effective region
511, 512 Phase shift mask blank
513 Phase shift mask
521, 522 Reflective mask blank
523 Reflective mask

The invention claimed is:

1. A photomask blank comprising a substrate, a film made of a chromium-containing material, and a film to be processed which is formed on a substrate side of the film made of a chromium-containing material and is processed using a pattern of the film made of a chromium-containing material as an etching mask, wherein
the film made of a chromium-containing material is a layered film having a three-layer structure consisting of, in order from a side away from the substrate, a first layer, a second layer and a third layer,
the first layer containing oxygen and nitrogen, and having a chromium content of 40 atom or less, an oxygen content of 50 atom % or more, a nitrogen content of 10 atom % or less and a thickness of 6 nm or less;
the second layer containing oxygen, nitrogen and carbon, and having a chromium content of 40 atom % or less, an oxygen content of 30 atom % or more, a nitrogen content of 17 atom % or more, a carbon content of 13 atom % or less and a thickness of 46 nm or more; and
the third layer containing oxygen and nitrogen, and having a chromium content of 50 atom % or more, an oxygen content of 20 atom % or less and a nitrogen content of 30 atom % or more.

2. The photomask blank of claim 1, wherein the third layer has a thickness of 4 nm or less.

3. The photomask blank of claim 1, wherein the film to be processed is a film made of a silicon-containing material.

4. The photomask blank of claim 3 which is a phase shift mask blank wherein the film made of a chromium-containing material is a light-shielding film, the film made of a silicon-containing material is a phase shift film, and the light-shielding film and the phase shift film have a combined optical density to exposure light of 3 or more.

5. The photomask blank of claim 4, wherein the film made of a chromium-containing material has a thickness of at least 48 nm and not more than 85 nm.

6. The photomask blank of claim 4, wherein the phase shift film has a phase difference with respect to exposure light of at least 175 degrees and not more than 185 degrees, a transmittance of at least 6% and not more than 30%, and a thickness of at least 60 nm and not more than 85 nm.

7. The photomask blank of claim 1, wherein the film to be processed is a film made of a tantalum-containing material.

8. The photomask blank of claim 7 which is a reflective mask blank wherein the film made of a tantalum-containing material is a film for absorbing extreme ultraviolet light (absorption film), the reflective mask blank further comprising a film for reflecting extreme ultraviolet light (reflection film) that is formed on the substrate side of the absorption film.

9. The photomask blank of claim 1, further comprising, on a side of the film made of a chromium-containing material which is away from the substrate, a resist film having a thickness at least 50 nm and up to 200 nm.

10. A method of manufacturing, from the photomask blank of claim 3, a photomask having a circuit pattern in a film made of a silicon-containing material, which method comprises the steps of:
(A) forming a resist film on the side of the film made of a chromium-containing material that is away from the substrate;
(C) patterning the resist film to form a resist pattern;
(D) patterning the film made of a chromium-containing material by dry etching the film with an oxygen-containing chlorine-based gas using the resist pattern as an etching mask so as to form a pattern in the film made of a chromium-containing material;
(E) patterning the film made of a silicon-containing material by dry etching the film with a fluorine-based gas using the pattern in the film made of a chromium-containing material as an etching mask so as to form a pattern in the film made of a silicon-containing material; and
(F) following step (E), leaving a portion of the film made of a chromium-containing material located at an outer peripheral edge of the substrate that is a region where a circuit pattern is not formed in the film made of a silicon-containing material and removing the pattern in the film made of a chromium-containing material in areas other than at the outer peripheral edge of the substrate by dry etching with an oxygen-containing chlorine-based gas.

11. The manufacturing method of claim 10, further comprising, between steps (A) and (C), the step of:
(B) stripping the resist film using a mixture of sulfuric acid and hydrogen peroxide and then newly forming a resist film on the side of the film made of a chromium-containing material that is away from the substrate.

12. A photomask having a substrate and, on the substrate, a circuit pattern in a film made of a silicon-containing material, wherein
a film made of a chromium-containing material is formed, in contact with the film made of the silicon-containing material, in a region located at an outer peripheral edge of the substrate where the circuit pattern in the film made of a silicon-containing material is not formed,
the film made of the chromium-containing material is a layered film having a three-layer structure consisting of, in order from a side away from the substrate, a first layer, a second layer and a third layer,
the first layer containing oxygen and nitrogen, and having a chromium content of 40 atom or less, an oxygen content of 50 atom % or more, a nitrogen content of 10 atom % or less and a thickness of 6 nm or less;
the second layer containing oxygen, nitrogen and carbon, and having a chromium content of 40 atom % or less, an oxygen content of 30 atom % or more, a nitrogen content of 17 atom % or more, a carbon content of 13 atom % or less and a thickness of 46 nm or more; and
the third layer containing oxygen and nitrogen, and having a chromium content of 50 atom % or more, an oxygen content of 20 atom % or less and a nitrogen content of 30 atom % or more.

13. The photomask of claim 12, wherein the third layer has a thickness of 4 nm or less.

14. The photomask of claim 12, wherein the film made of a chromium-containing material is a light-shielding film, the film made of a silicon-containing material is a phase shift film, and the light-shielding film and the phase shift film have a combined optical density to exposure light of 3 or more.

15. The photomask of claim 14, wherein the film made of the chromium-containing material has a thickness of at least 48 nm and not more than 85 nm.

16. The photomask of claim 14, wherein the phase shift film has a phase difference with respect to exposure light of at least 175 degrees and not more than 185 degrees, a transmittance of at least 6% and not more than 30%, and a thickness of at least 60 nm and not more than 85 nm.

* * * * *